United States Patent
Rolfson

(10) Patent No.: US 6,555,298 B1
(45) Date of Patent: Apr. 29, 2003

(54) METHOD AND APPARATUS FOR UNIFORMLY BAKING SUBSTRATES SUCH AS PHOTOMASKS

(75) Inventor: J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 09/643,466

(22) Filed: Aug. 22, 2000

(51) Int. Cl.$^7$ ................................................. G03F 7/26
(52) U.S. Cl. ..................... 430/330; 430/270.1; 427/532; 165/80.5
(58) Field of Search ............................... 430/330, 270.1; 427/532; 165/80.5

(56) References Cited

U.S. PATENT DOCUMENTS

| | | | |
|---|---|---|---|
| 5,275,237 A | 1/1994 | Rolfson et al. ............ 165/80.5 |
| 5,716,763 A | * 2/1998 | Benoit et al. ............... 430/330 |
| 5,983,644 A | * 11/1999 | Bolandi et al. ............... 62/3.2 |
| 6,018,616 A | * 1/2000 | Scaper ....................... 392/418 |

* cited by examiner

Primary Examiner—Janet Baxter
Assistant Examiner—Amanda C. Walke
(74) Attorney, Agent, or Firm—Fletcher, Yoder & Van Someren

(57) ABSTRACT

A method and apparatus for baking a film onto a substrate. A film, such as a layer of photoresist, is disposed on a first surface of a substrate while a second surface is exposed to a liquid bath. The liquid bath is maintained at a pre-selected temperature. Exposure of the substrate to the liquid bath allows the film on the opposite surface to bake. The liquid bath is then re-circulated to maintain a constant and uniform temperature gradient across the substrate.

18 Claims, 2 Drawing Sheets

METHOD AND APPARATUS FOR UNIFORMLY BAKING SUBSTRATES SUCH AS PHOTOMASKS

BACKGROUND OF THE INVENTION

1. Field of the Invention

The present invention relates generally to semiconductor fabrication. More particularly, the present invention relates to the process of photolithography, and even more specifically to baking a photoresist onto a substrate, such as a photomask, during the photolithography process.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

During fabrication of a semiconductor device, a process called photolithography is employed to create patterns on a semiconductive substrate, commonly known as a wafer. The wafer is built up one layer at a time creating an overlay of complex patterns which ultimately form electrical devices and paths. The photolithography process comprises a variety of steps to accomplish the patterning of each layer. One common step of the process involves the use of one or more photomasks. Each photomask has a pattern formed thereon, and this pattern is transferred onto a semiconductor wafer by irradiating the wafer through the photomask.

To fabricate a photomask, surface preparation is required wherein a surface of the substrate, often referred to as a photomask blank, is cleaned and dried. The substrate may be composed any of a number of materials. For example, the photomask blank may be made of glass or quartz. Surface preparation of the substrate is done in anticipation of a photoresist being applied to the substrate's surface. The photoresist requires a clean and dry surface in order to accomplish a high level of adhesion. The photoresist is typically applied by placing a coat of the material on the substrate and then spinning the substrate to obtain a thin uniform film across the blank's surface. After the photoresist has been applied, the blank and film are subjected to a first baking process often referred to as soft bake or pre-bake. The soft bake process serves to evaporate a portion of the photoresist solvents. Besides removing unwanted solvents, which will interfere with subsequent processing, the soft bake also helps to facilitate better adhesion between the photoresist and the substrate. After the soft bake the photoresist remains as a relatively soft coating on the substrate.

The baking process may be accomplished using various methods. Two of the more typical methods include use of a hot plate or the use of a convection oven. In the hot plate method, the substrate is placed directly on the hot plate for heating by conduction. Heat is transferred from the hot plate to the photomask blank and then through the blank to the photoresist layer. This technique provides good temperature control and allows for small batches to be processed simultaneously.

Alternatively, the convection oven method utilizes a fluid medium, usually a gas such as air, to heat the substrate and film. Convection baking allows for a more direct baking of the photoresist layer since convection baking does not have to rely on conduction through the substrate. Convection ovens permit large batches of photomasks to be processed at one time, but typically these ovens have inferior temperature control in comparison with the hot plate method. Convection ovens also typically take longer per batch to process than do hot plates. Other alternative methods for baking include microwave, infra-red, and vacuum oven baking.

Various sources of exposure, including optical sources, x-rays or ion beams, may be used for exposing the photoresist. The exposure causes a chemical reaction to take place in the photoresist layer. For example, in one type of photoresist, exposure causes a polymerization of the photoresist. Thus, by using a mask and an exposure source, a pattern of polymerized resist (and a mating pattern of non-polymerized resist) is formed on the surface of the wafer. This process, while described above in general terms, is actually rather complex and involved. Likewise, there are various exposure sources to choose from, each with its own advantages and complexities. Also, there are multiple types of photoresist. Each type of photoresist has different characteristics and responds differently to the various manipulative steps in the photolithography process.

After the film of photoresist has been exposed, the photoresist is then developed. Developing is a chemical process wherein chemical dissolution of unpolymerized regions in the photoresist occurs. Different developing chemicals and techniques are often employed depending on the type of photoresist being used. After the photoresist has been developed, the chemical is rinsed off and the substrate is allowed to dry. Polymerized regions of the photoresist remain on the surface of the substrate. After developing of the photoresist, the substrate may optionally undergo a second baking process. The second baking process, often referred to as hard bake, again serves to evaporate remaining solvents in the photoresist and to create better adhesion of the photoresist to the substrate. The methods and techniques used for hard baking are essentially the same as those used for soft baking.

While described in generalities above, the process for fabricating photomasks is complex and requires careful attention to many details. Mistakes and errors can be introduced at any step of the process causing resultant defects in the final product. Likewise, each step of the process is continually scrutinized for possible improvements. One area where improvement is contemplated is in the baking processes. A good deal of variability may be introduced into the process during the baking steps. For example, it has been noted that the temperature gradient found in a substrate during baking is not uniform. This means that the temperature at the outside edge of the substrate is not the same as the temperature at the center of the substrate. Often the range of the temperature gradient is several degrees. The variation of temperature results in uneven baking of the photoresist layer. The uneven baking can lead to poor performance of the photoresist layer during the exposure and developing steps. For example, the lines formed in the photoresist layer during exposure and developing can vary in width depending on their location on the photomask blank. A region of the photoresist layer baked at the desired temperature will produce lines at a predicted width, however, a region of the photoresist layer baked at the varied temperature will produce lines which vary from the predicted width. Thus the precision of the exposed image becomes a function of the temperature gradient experienced by the photoresist layer.

In consideration of the heating methods employed, numerous factors affect the resultant baked film. For example, one problem with the hot plate method of baking is that the surface of the hot plate may not be co-incidentally parallel with the surface of the substrate being baked. The result of the two surfaces not being exactly parallel is air gaps present between the two surfaces. Since the hot plate method of baking is a process of conduction, the air gaps create an inefficiency because localized regions experience heat transfer by convection instead of conduction. The conduction transfers the heat to the substrate much quicker than does the convection in the air gaps. Therefore, heat is unevenly distributed to the surface of the substrate from the hot plate. Again the ultimate result is an undesired temperature gradient in the substrate and non-uniform baking of the photoresist layer.

Another problem associated with hot plate baking is the transient formation of temperature zones in the hot plate. This is often the result of a rapid temperature spike in the heating element. The heating element attains a specific temperature and then the surrounding material tries to attain the same temperature as the heating element. Simply stated, the hot plate is trying come to an equilibrium temperature, but in the process temperature zones are created. These temperature zones are transient, but can result in similar temperature zones being transferred to the substrate and film. As an example, on study has found that, depending on the particular steps and methods followed, hot plate baking may result in temperature variations of from 3° to 6° C. over a 132 mm square area.

While convection ovens generally do a better job in respect to minimizing the production of temperature zones, there are opportunities for improvement. For example, the medium used for heat transfer in convection ovens is typically air. Convection by air is not as efficient as the hot plate method of conduction. The relative inefficiency of air as heat transfer medium is one reason why the convection method is typically slower than the hot plate method.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, a method of baking a photomask is provided. The method includes providing a substrate having two surfaces wherein a film, such as a layer of photo resist, is disposed on one of the surfaces. The uncoated surface is then exposed to a temperature controlled liquid bath. Exposure of the substrate to the liquid bath is maintained for a predetermined time to allow the film to bake. Re-circulation of the liquid bath maintains a substantially constant temperature gradient across the substrate.

In accordance with another aspect of the present invention, an apparatus and a related system is provided to allow a film to be baked on a substrate more uniformly. The apparatus includes a first tank for containing a liquid bath. The first tank may be disposed inside a second tank to help facilitate re-circulation of the liquid bath. The substrate is partially disposed within the first tank having a surface exposed to the liquid bath. A re-circulation system is provided to circulate the liquid bath against the exposed surface of the substrate. The re-circulation system also allows for the liquid to be exposed to a temperature controlling unit such as a heat exchanger.

In accordance with yet another aspect of the present invention, a system for uniformly baking a film on a substrate is provided utilizing many features of the disclosed apparatus. The system takes advantage of these features to provide batch baking of the substrates.

DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
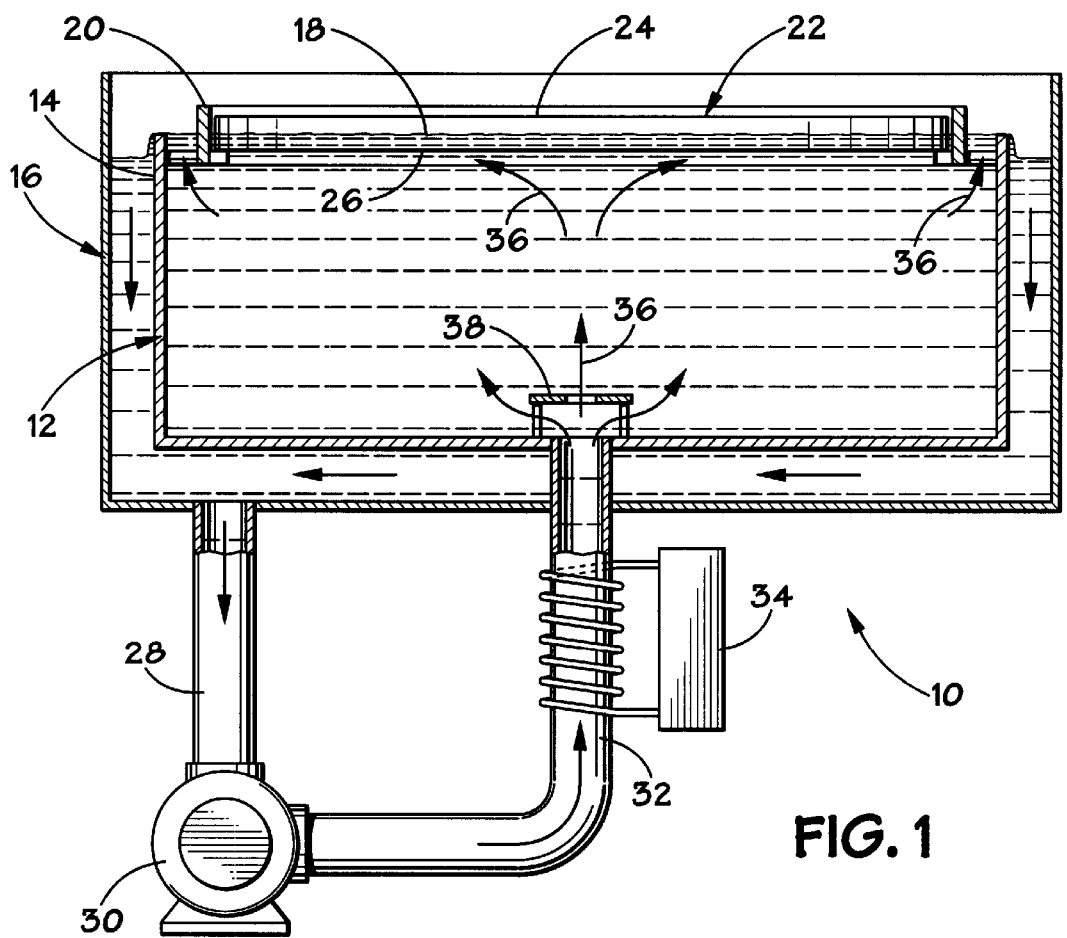
FIG. 1 illustrates a sectional view of one embodiment according to the present invention.

Turning now to the drawings, and referring initially to FIG. 1, a baking apparatus 10 according to the present invention is shown. The baking apparatus 10 includes a primary tank 12 which is formed with a wall 14 that defines an upper limit, or a fluid level, for the primary tank 12. The primary tank 12 is disposed within a secondary tank 16. A liquid bath 18, such as propylene glycol, is held in the primary tank 12 and fills the primary tank 12 to capacity.

A retaining device 20 is partially disposed within the primary tank 12 and holds a substrate 22. The substrate 22 is contemplated as being a photomask, a flat panel display, or any other suitable substrate undergoing a bake process. The substrate 22 has a first surface 24 upon which a film is disposed (not shown). The film disposed on the substrate 22 is a photoresist film which is utilized in a photolithography process. However, it is noted that for other applications the film may be formed of a different material. The substrate 22 also has a second surface 26. The substrate 22 is placed in the retaining device 20 such that the second surface 26 is exposed to the liquid bath 18.

Attached to the secondary tank 16 is a return line 28. The return line 28 accommodates the flow of any excessive liquid bath 18 which flows over the wall 14 of the primary tank 12. The return line 28 is coupled to a circulating device 30 such as a pump. A supply line 32 is coupled to the pump 30 and carries the liquid bath 18 back to the primary tank 12. A temperature control unit 34, such as a heat exchanger, is disposed adjacent the supply line 32. While the circulating device 30 and the temperature control unit 34 are shown as being separate devices in FIG. 1, they may be combined into a single unit. The temperature control unit may have a broad temperature range, such as 80° to 200° C., with a preferred operating range of 100° to 120° C., and precise temperature control such as ±0.05 to 0.1° C. Of course the upper level temperature range will have some limit placed upon it depending on the fluid used for the liquid bath.

The basic operation of the baking apparatus 10 will now be described with reference to the fluid flow lines 36 as shown in FIG. 1. Starting at the pump 30, the liquid bath 18 is pumped through the supply line 32 where it is heated to a pre-selected temperature by the temperature control unit 34. The liquid bath 18 then flows into the primary tank 12. Advantageously, a baffle 38 or series of baffles are used to control the flow of the liquid bath 18 and properly disperse it as it enters the primary tank 12. The liquid bath 18 then circulates through the primary tank 12. The flow of the liquid bath 18, as generally shown by fluid flow lines 36, is upward and radially outward from the center of the primary tank 12. The wall 14 of the primary tank 12 serves as a weir, or a simple fluid level control, allowing excess fluid to spill over in the secondary tank 16. The excess fluid collects in the secondary tank 16 and flows through the return line 28 and back to the pump 30 to be re-circulated through the system again.

The baking apparatus 10 allows the second surface 26 of the substrate 22 to be exposed to a circulating liquid bath 18 which is being controlled to a substantially constant temperature as described above. The heat supplied to the second surface 26 is conducted through the substrate 22 to bake the film disposed on the first surface 24 substantially uniformly. Because the second surface 26 is exposed to the liquid bath 18, a fluid and compliant medium, there are no gaps such as those associated with a typical hot plate. Also, because the heat transfer process of the system is forced convection, there is a reduction of temperature zones as experienced with a conductive hot plate. In comparison with a convectional oven utilizing air as a medium, the liquid bath 18 offers a more controlled and efficient medium of convection. In sum, substrate 22 is exposed to a more uniform and efficient heat transfer process.

Figure 2:
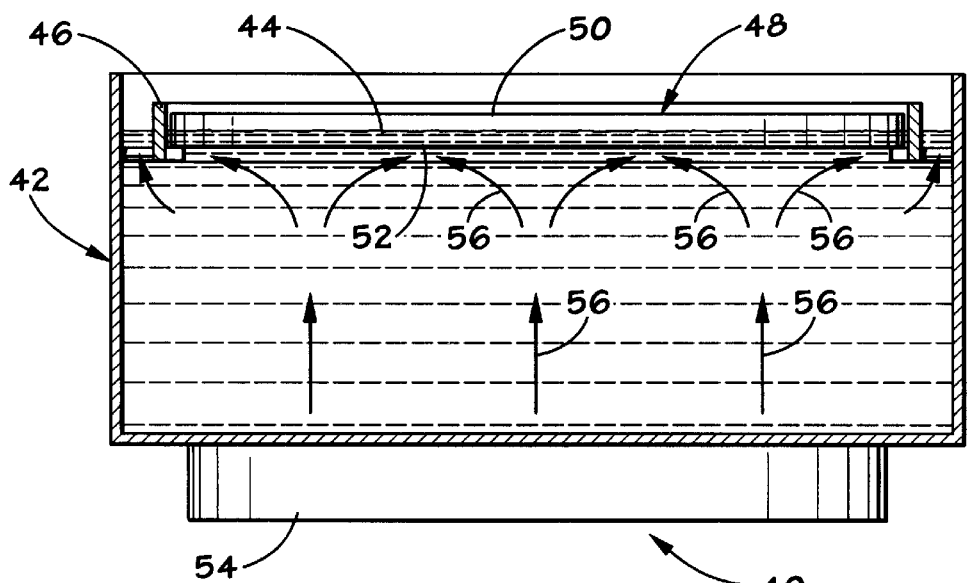
FIG. 2 illustrates a sectional view of an alternative embodiment according to the present invention.

Turning now to FIG. 2, an alternative embodiment is disclosed. The baking apparatus 40 includes a tank 42. The tank 42 may be similar to the primary tank disclosed in FIG. 1. The tank 42 contains a liquid bath 44. Unlike the embodiment of FIG. 1, the tank 42 is not filled to capacity with the liquid bath 44. The liquid bath 44 may be any of a number of suitable liquids such as propylene glycol, ethylene glycol, or petroleum based or synthetic oils. It is important however, that the liquid bath be compatible with any resist being used to form a film on the substrate 48.

A retaining device 46 is disposed within the primary tank 42 and partially disposed within the liquid bath 44. The retaining device 46 positions and holds a substrate 48 within the tank 42. The substrate 48 is contemplated as being a photomask, a flat panel display, or any other suitable substrate undergoing a baking process. The substrate 48 has a first surface 50 upon which a film (not shown) has been disposed. The film disposed on the substrate 48 may be a photoresist film utilized in a photolithography process. However, it is noted that for other substrates the film may be formed of a different material. The substrate 48 is placed in the retaining device 46 such that a second surface 52 is exposed to the liquid bath 44.

Attached to the tank 42 is a temperature control unit 54, such as a heat exchanger. The temperature control unit 54 is shown as being disposed at the bottom of the tank 42. The temperature control unit 54 is used to control the temperature of the liquid bath 44. In the embodiment shown, the temperature control unit 54 is placed so as to conduct heat through the tank 42 to the liquid bath 44. However, it is contemplated that alternative arrangements could be utilized for controlling the temperature of the liquid bath 44.

In operation, the temperature control unit 54 heats the liquid bath to a desired temperature and maintains the desired temperature within ±0.05 to 0.1° C. Because the temperature control unit 54 is placed at the bottom of the tank 42, the liquid bath 44 at the bottom of the tank 42 heats first. The liquid bath 44 at the bottom of the tank 42 becomes less dense as it rises in temperature and so begins to rise to the top of the tank 42. Liquid bath 44 towards the top of the tank, having a slightly lower temperature, circulates to the bottom of the tank because of its higher density. This circulation pattern is known as natural convection. The circulation of the liquid bath 44 is generally indicated by the flow lines 56. The liquid bath 44 flows in a manner which allows constant convectional heat transfer from the liquid bath 44 to the second surface 52 of the substrate 48.

In sum, the baking apparatus 40 as described allows the second surface 52 of the substrate 48 to be exposed to a circulating liquid bath 44. The heat supplied to the second surface 52 is conducted through the substrate 48 to bake the film disposed on the first surface 50 substantially uniformly. Because the second surface 52 is exposed to the liquid bath 44 there are no air gaps as found in a typical hot plate. The entire substrate is subject to the same heat transfer process with a resulting substantially uniform temperature gradient.

Figure 3:
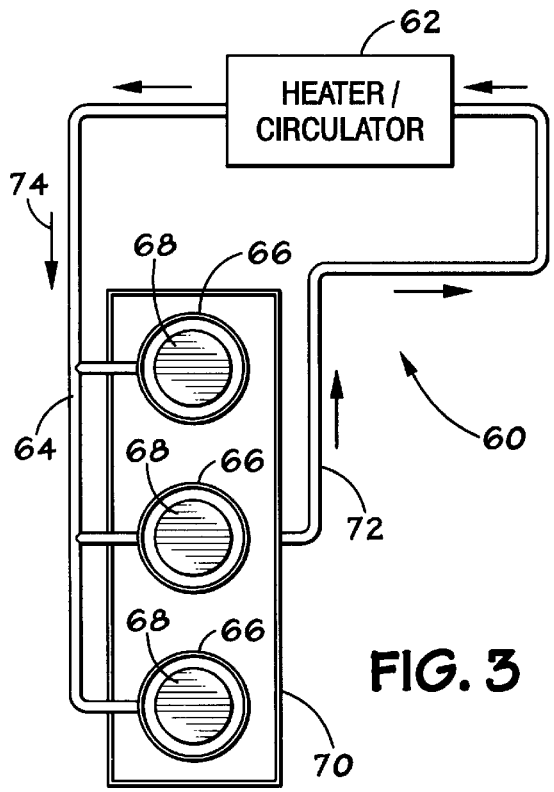
FIG. 3 illustrates a schematic of an alternative embodiment of the invention.

Turning now to FIG. 3, an alternative baking system 60, based on the general embodiment disclosed in FIG. 1, will now be discussed. A combined circulation/temperature control unit 62 is connected to a supply line 64. The supply line 64 carries liquid bath to a plurality of primary tanks 66. The primary tanks 66 are considered to be similar to that shown in FIG. 1. The primary tanks 66 are filled with a liquid bath to capacity (not shown). Similar to the configuration shown in FIG. 1, a substrate 68 is disposed so that a bottom surface of the substrate is exposed to the liquid bath. Excess liquid bath is carried over the walls of the primary tanks 66 into a common secondary tank 70. The secondary tank 70 is connected to a return line 72 which conveys the excess liquid bath back to the circulation/temperature unit 62 to be processed once again. The general flow of the liquid bath is indicated by the flow lines 74.

The baking system 60 operates in a similar manner to the baking apparatus 10 disclosed above, however, the baking system 60 is designed more particularly for batch operations. It is noted that in the baking system 60, a single supply line proceeds from the circulation/temperature unit 62 but later divides into individual lines for each primary tank 66. The individual lines are shown to be in parallel with one another, thus a distribution of liquid bath having uniform temperature is provided to each primary tank 66.

Figure 4:
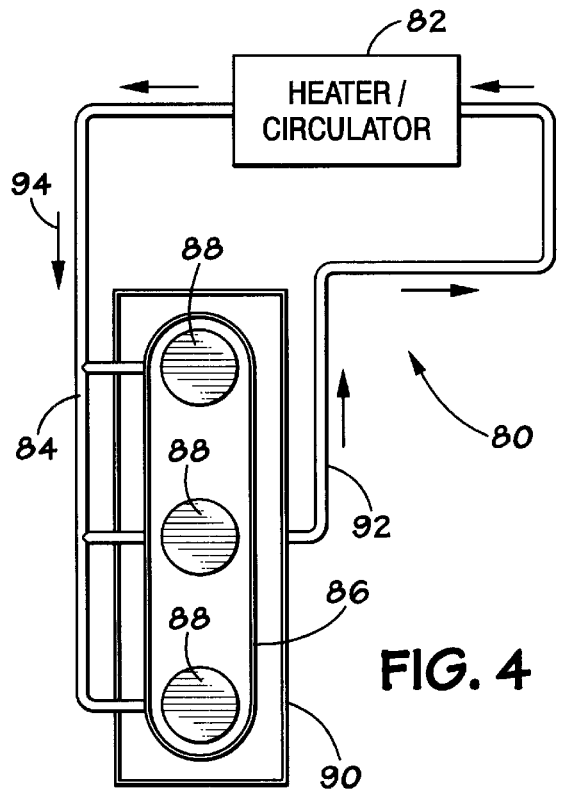
FIG. 4 illustrates a schematic of another alternative embodiment of the invention.

FIG. 4 discloses an alternative baking system 80 for batch operations. A combined circulation/temperature control unit 82 is connected to a supply line 84. The supply line 84 carries liquid bath to a primary tank 86. The primary tank 86 is, in general, considered to be similar to that shown in FIG. 1 with the difference of the primary tank 86 facilitating multiple substrates 88. The primary tanks 86 is filled with a liquid bath to capacity (not shown). Multiple substrates 88 are disposed so that the bottom surface of each substrate is exposed to the liquid bath. Again, excess liquid bath is carried over the wall of the primary tank 86 into a secondary tank 90. The secondary tank 90 is connected to a return line 92 which conveys the excess liquid bath back to the circulation/temperature unit 82 to be processed once again. The general flow of the liquid bath through the system is indicated by the flow lines 94.

The baking system 80 operates similarly to the baking system 60 discussed above. However, the baking system 80, as shown in FIG. 4, utilizes a single primary tank for heating multiple substrates. In the baking system 80, a single supply line proceeds from the circulation/temperature unit 82 but later divides into multiple feed lines before connection with the primary tank 86. The individual supply lines are shown to be in parallel with each other and can be designed to render a specific distribution and flow of the liquid bath within the primary tank 86. The desired flow and distribution of the liquid bath may be accomplished in various ways. For example, proper baffle configurations and/or strategic locations of supply line inlets will help to create a proper flow and distribution of the liquid bath.

It should be noted that various modifications and alternative embodiments are contemplated as being within the scope of the invention. For example, the retaining device used to hold the substrate may be a conductive or insulative element depending on the overall design of the apparatus or system. Also, the retaining device may be formed of a single continuous unit for each substrate, multiple elements per substrate, or one unit which will accommodate multiple substrates. The retaining device may be coupled to one of the tanks, or it may be a component of separate but related automation equipment used to place the substrate into the baking apparatus or system.

Figure 5:
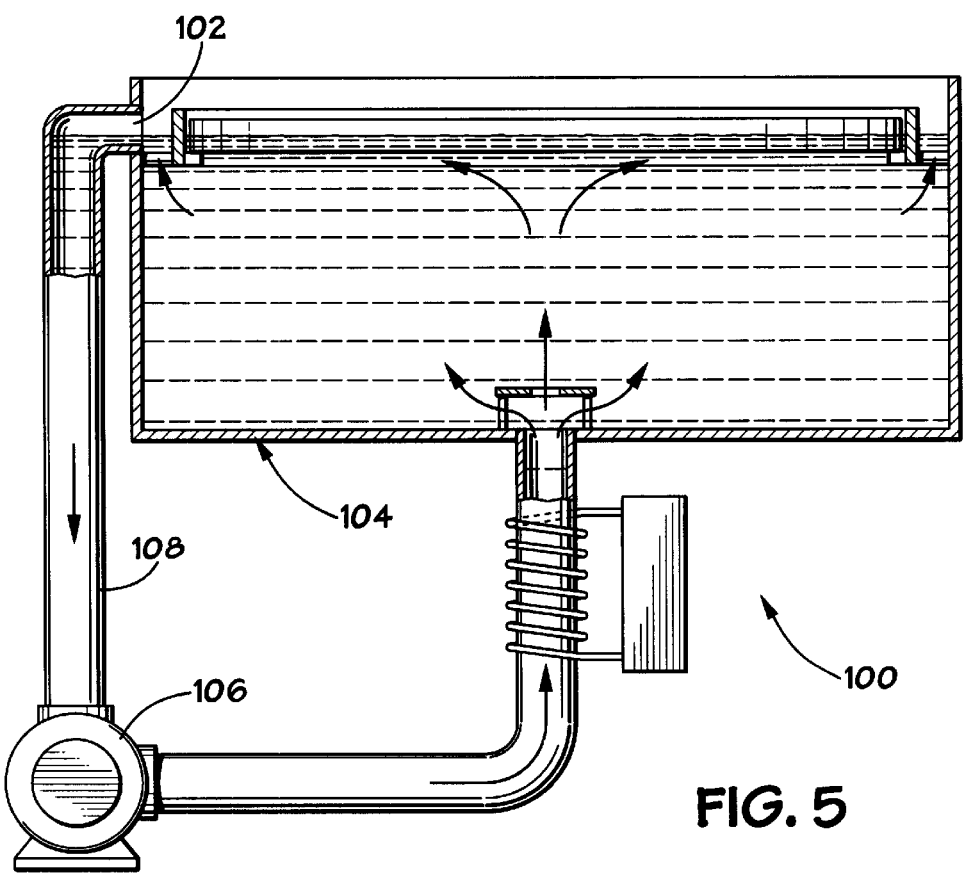
FIG. 5 illustrates a sectional view of another alternative embodiment of the invention.

It is also contemplated that in the embodiments using a re-circulation system a secondary tank may not be utilized. Instead, a drain or overflow could be provided in the primary tank with appropriate piping to connect the overflow with the pump system. Such an embodiment is disclosed in FIG. 5, showing a baking system 100 utilizing an overflow device 102 in the primary tank 104. The overflow device 102 is connected to a circulation system 106 by means of a return line 108. The overall operation of the baking system 100 remains the same as disclosed above. Of course multiple overflow devices could be implemented, each being strategically placed for additional flow control. The secondary tank disclosed in the embodiment of FIG. 1 is, in actuality, a continuous overflow located around the periphery of the primary tank.

Also, while the disclosed embodiments all have been disclosed in terms of baking a film onto a substrate, and thus heating of the substrate has been contemplated, the embodiments may be utilized for cooling or quenching of a substrate or other similar work piece. The temperature control unit would thus act to cool the liquid bath rather than heat it. The liquid bath would then cool the surface of the substrate by convection. It is noted that such an embodiment would be more readily accomplished with a forced convection device such as that disclosed in FIG. 1 than with a natural convection device such as that shown in FIG. 2.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of baking a substrate comprising:

providing a substrate having a first surface wherein a film is disposed on the second surface;

exposing only the second surface to a liquid bath;

controlling the temperature of the liquid bath;

maintaining the exposure of the second surface to the liquid bath for a predetermined time to allow the film to bake on the first surface; and subjecting the film to an independent secondary heat source simultaneously with the exposure of the second surface to the liquid bath.

2. The method of claim 1, wherein the substrate is a photomask.

3. The method of claim 1, wherein the temperature of the liquid bath is controlled to ±0.05 to 0.1° C.

4. The method of claim 1, wherein the substrate is a flat panel display.

5. The method of claim 1, wherein the liquid bath is circulated by natural convection.

6. The method of claim 1, comprising circulating the liquid bath adjacent the second surface of the substrate.

7. The method of claim 6 wherein controlling the temperature of the liquid bath comprises re-circulating the liquid bath through a heat exchanger.

8. The method of claim 1, wherein the film comprises a layer of photoresist.

9. The method of claim 1, wherein the liquid bath comprises propylene glycol.

10. A method of baking a substrate comprising:

providing a substrate having a first surface and a second surface wherein a film is disposed on the first surface;

exposing the second surface to a liquid bath;

controlling the temperature of the liquid bath;

maintaining the exposure of the second surface to the liquid bath for a predetermined time to allow the film to bake on the first surface; and subjecting the film to an independent secondary heat source simultaneously with the exposure of the second surface to the liquid bath.

11. The method of claim 10, wherein the substrate is a photomask.

12. The method of claim 10, wherein the temperature of the liquid bath is controlled to ±0.05 to 0.1° C.

13. The method of claim 10, wherein the substrate is a flat panel display.

14. The method of claim 10, wherein the liquid bath is circulated by natural convection.

15. The method of claim 10, comprising circulating the liquid bath adjacent the second surface of the substrate.

16. The method of claim 15 wherein controlling the temperature of the liquid bath comprises re-circulating the liquid bath through a heat exchanger.

17. The method of claim 10, wherein the film comprises a layer of photoresist.

18. The method of claim 10, wherein the liquid bath comprises propylene glycol.

\* \* \* \* \*